US010990317B2

(12) United States Patent
Veches et al.

(10) Patent No.: US 10,990,317 B2
(45) Date of Patent: Apr. 27, 2021

(54) MEMORY WITH AUTOMATIC BACKGROUND PRECONDITION UPON POWERUP

(71) Applicant: Micron Technology, Inc., Boise, ID (US)

(72) Inventors: Anthony D. Veches, Boise, ID (US); Debra M. Bell, Boise, ID (US); James S. Rehmeyer, Boise, ID (US); Robert Bunnell, Boise, ID (US); Nathaniel J. Meier, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/553,859

(22) Filed: Aug. 28, 2019

(65) Prior Publication Data

US 2021/0064271 A1 Mar. 4, 2021

(51) Int. Cl.
*G06F 3/06* (2006.01)
*G11C 17/16* (2006.01)
(Continued)

(52) U.S. Cl.
CPC .......... *G06F 3/0655* (2013.01); *G06F 3/0604* (2013.01); *G06F 3/0673* (2013.01);
(Continued)

(58) Field of Classification Search
CPC .... G06F 3/0604; G06F 3/0655; G06F 3/0673; G11C 11/4072; G11C 11/4091; G11C 17/16; G11C 17/18
See application file for complete search history.

(56) References Cited

U.S. PATENT DOCUMENTS

| 7,266,025 | B2 * | 9/2007 | Nagai | ................ | G06F 11/1008 365/200 |
| 2007/0165467 | A1 * | 7/2007 | Kohara | ................ | G11C 29/802 365/200 |

(Continued)

OTHER PUBLICATIONS

U.S. Appl. No. 16/553,821—Unpublished U.S. Patent Application by Anthony D. Veches et al., titled "Memory With Automatic Background Precondition Upon Powerup", filed Aug. 28, 2019, 25 pages.

*Primary Examiner* — Yaima Rigol
*Assistant Examiner* — Kendrick Lam
(74) *Attorney, Agent, or Firm* — Perkins Coie LLP

(57) ABSTRACT

Memory devices and systems with automatic background precondition upon powerup, and associated methods, are disclosed herein. In one embodiment, a memory device includes a memory array having a plurality of memory cells at intersections of memory rows and memory columns. The memory device further includes sense amplifiers corresponding to the memory rows. When the memory device powers on, the memory device writes one or more memory cells of the plurality of memory cells to a random data state before executing an access command received from a user, a memory controller, or a host device of the memory device. In some embodiments, to write the one or more memory cells, the memory device fires multiple memory rows at the same time without powering corresponding sense amplifiers such that data stored on memory cells of the multiple memory rows is overwritten and corrupted.

19 Claims, 3 Drawing Sheets

(51) Int. Cl.
 G11C 17/18 (2006.01)
 G11C 11/4072 (2006.01)
 G11C 11/4091 (2006.01)
(52) U.S. Cl.
 CPC ...... G11C 11/4072 (2013.01); G11C 11/4091 (2013.01); G11C 17/16 (2013.01); G11C 17/18 (2013.01)

(56) References Cited

U.S. PATENT DOCUMENTS

| | | | |
|---|---|---|---|
| 2013/0258748 A1* | 10/2013 | Kim | G11C 7/14 |
| | | | 365/96 |
| 2013/0258794 A1* | 10/2013 | Sharad | G11C 7/08 |
| | | | 365/205 |
| 2014/0040338 A1* | 2/2014 | Van Der Sluis | G06F 7/588 |
| | | | 708/254 |

* cited by examiner

MEMORY WITH AUTOMATIC BACKGROUND PRECONDITION UPON POWERUP

CROSS-REFERENCE TO RELATED APPLICATION(S)

This application contains subject matter related to a concurrently-filed U.S. patent application by Anthony D. Veches et al. titled "MEMORY WITH AUTOMATIC BACKGROUND PRECONDITION UPON POWERUP," which is assigned to Micron Technology, Inc., is identified by Ser. No. 16/553,821, and is incorporated herein by reference in its entirety.

TECHNICAL FIELD

The present disclosure is related to memory systems, devices, and associated methods. In particular, the present disclosure is related to memory devices with automatic background precondition upon powerup.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
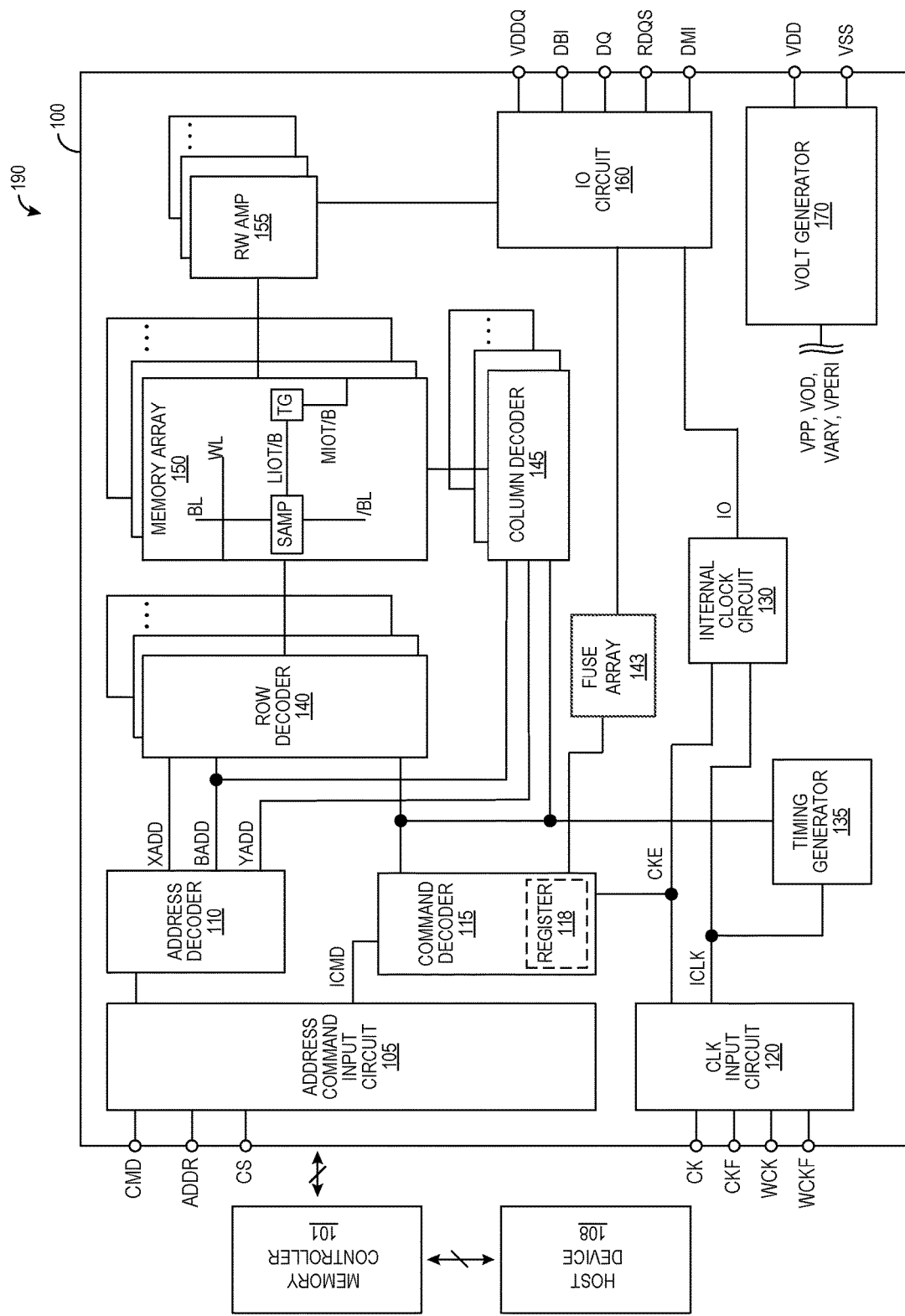
FIG. 1 is a block diagram schematically illustrating a memory system configured in accordance with various embodiments of the present technology.

As discussed in greater detail below, the technology disclosed herein relates to memory systems and devices (and associated methods) that precondition all or a subset of the memory array to a desired state as part of a background operation that is executed automatically when the memory devices are powered on. A person skilled in the art, however, will understand that the technology may have additional embodiments and that the technology may be practiced without several of the details of the embodiments described below with reference to FIGS. 1-3. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

A host memory system often includes one or more memory devices that are used to store information. The host memory system can employ one or more security measures to prevent a nefarious actor from reading and/or manipulating the information while the memory devices are installed in the host memory system. For example, when the nefarious actor issues a read request identifying memory addresses corresponding to a restricted portion of a memory array of a memory device, the host memory system can prevent the nefarious actor from accessing information stored in the restricted portion of the memory array by returning errors messages and/or invalid data in response to the read request. As another example, the host memory system can restrict certain commands (e.g., read, write, or other access commands) to only authorized users.

When the information is stored on memory cells of volatile memory devices, the host system is configured to periodically refresh the memory cells to prevent data loss from charge leakage. As the volatile memory devices are powered down or are otherwise disconnected from power, the memory cells of the volatile memory devices are no longer refreshed. Absent intervening power, charge leaks from the memory cells until the information stored on the memory cells becomes corrupted (e.g., is no longer accurately readable). This corruption process, however, is not immediate. Thus, the information can remain accurately readable for a period of time after the volatile memory devices are powered down or are otherwise disconnected from power. As a result, a nefarious actor could potentially extract information stored on conventional memory devices by quickly transferring (e.g., hot-swapping) the conventional memory devices from a host memory system to a hostile memory system that either does not employ the security measures identified above or is configured to circumvent such security measures.

To address this concern, several embodiments of the present technology are directed to memory devices, systems including memory devices, and methods of operating memory devices in which memory cells in a memory array of a memory device are programmed to a desired (predetermined) state as part of a background operation that is automatically executed during powerup of the memory device (e.g., before the memory devices execute an access or other command received from a user, a memory controller, and/or a host device). In some embodiments, the desired state can be a known state (e.g., a predetermined string of data) that is stored in a fuse array of the memory device. In these and other embodiments, the memory device can automatically program all or a subset of the memory array to the known state when the memory device is powered on. In these and still other embodiments, the desired state can be a random (e.g., corrupted) state, and the memory device can automatically program all or a subset of the memory array to the random state during powerup by firing multiple rows of memory cells in the memory array without powering the corresponding sense amps, such that nearby rows of memory cells overwrite and corrupt each other with their data. Under either approach, any valid information that persists on the memory cells after the memory device is powered down or is otherwise disconnected from power is automatically overwritten and/or corrupted when the memory device is powered on.

FIG. 1 is a block diagram schematically illustrating a memory system 190 configured in accordance with an embodiment of the present technology. The memory system 190 can include a memory device 100 that can be connected to any one of a number of electronic devices that is capable of utilizing memory for the temporary or persistent storage of information, or a component thereof. For example, the memory device 100 can be operably connected to a host device 108 and/or to a memory controller 101. The host device 108 operably connected to the memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to the memory device 100, although in other embodiments, the host device 108 may be indirectly connected to the memory device 100 (e.g., over a networked connection or through intermediary devices, such as through the memory controller 101).

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, and VDDQ.

The power supply terminals of the memory device 100 may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in a row decoder 140, the internal potentials VOD and VARY can be used in sense amplifiers included in a memory array 150 of the memory device 100, and the internal potential VPERI can be used in many other circuit blocks.

The power supply terminals may also be supplied with power supply potential VDDQ. The power supply potential VDDQ can be supplied to an input/output (JO) circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 160 so that power supply noise generated by the IO circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from a command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals (not shown) to the command decoder 115. The internal clock circuit 130 can further provide input/output (IO) clock signals. The 10 clock signals can be supplied to the IO circuit 160 and can be used as a timing signal for determining an output timing of read data and the input timing of write data. The 10 clock signals can be provided at multiple clock frequencies so that data can be output from and input into the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated that can be used by the command decoder 115, the column decoder 145, and/or other components of the memory device 100.

The memory device 100 may include an array of memory cells, such as memory array 150. The memory cells of the memory array 150 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks, one or more memory rows in a memory banks, or another arrangement of memory cells. In these and other embodiments, the memory regions of the memory array 150 can be arranged in one or more groups (e.g., one or more groups of memory banks, one or more logical memory ranks or dies, etc.). Memory cells in the memory array 150 can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The command terminals and address terminals may be supplied with an address signal and a bank address signal from outside the memory device 100. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals can be supplied with command signals CMD, address signals ADDR, and chip selection signals CS (e.g., from the memory controller 101 and/or the host device 108). The command signals may represent various memory commands (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown) to the command decoder 115. The command decoder 115 may further include one or more registers 118 for tracking various counts or values (e.g., counts of refresh commands received by the memory device 100 or self-refresh operations performed by the memory device 100; memory regions enabled for refresh operations; a last programmed and/or next-to-be programmed memory cell, memory row, memory column, memory bank, logical memory rank or die, and/or other memory region; etc.).

When a read command is issued, and a row address and a column address are timely supplied with the read command, read data can be read from memory cells in the memory array 150 designated by these row address and column address. The read command may be received by the command decoder 115, which can provide internal commands to the IO circuit 160 so that read data can be output from the data terminals DQ, RDQS, DBI, and DMI via read/write (RW) amplifiers 155 and the IO circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued, and a row address and a column address are timely supplied with the command, write data can be supplied to the data terminals DQ, DBI, and DMI according to the WCK and WCKF clock signals. The write command may be received by the command decoder 115, which can provide internal commands to the IO circuit 160 so that the write data can be received by data receivers in the IO circuit 160, and supplied via the IO circuit 160 and the RW amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The memory array 150 may be refreshed or maintained as described herein to prevent data loss, either due to charge leakage or imprint effects. A refresh operation, as described herein, may be initiated by the memory system 190 (e.g., by the host device 108, the memory controller 101, and/or the memory device 100), and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory device 100 may be configured to refresh the same row of memory cells in every memory bank of the memory array 150 simultaneously. In another approach, the memory device 100 may be configured to refresh the same row of memory cells in every memory bank of the memory array 150 sequentially. In still another approach, the memory device 100 can further include circuitry (e.g., one or more registers, latches, embedded memories, counters, etc.) configured to track row (e.g., word line) addresses, each corresponding to one of the memory banks in the memory array 150. In this approach, the memory device 100 is not constrained to refresh the same row in each memory bank of the memory array 150 before refreshing another row in one of the memory banks.

Regardless of the refresh approach, the memory device 100 can be configured to refresh memory cells in the memory array 150 within a given refresh rate or time window (e.g., 32 ms, 28 ms, 25 ms, 23 ms, 21 ms, 18 ms, 16 ms, 8 ms, etc.). In these embodiments, the memory system 190 can be configured to supply refresh commands to the memory device 100 in accordance with a specified minimum cadence tREFI. For example, the memory system 190 can be configured to supply one or more refresh commands to the memory device 100 at least every 7.8 μs such that an approximate minimum of 4000 refresh commands are supplied to the memory device 100 within a 32 ms time window.

The memory device 100 may include a fuse array 143. The fuse array 143 can include antifuse elements. An antifuse element is an element which is insulated in an initial state and, when subjected to a dielectric breakdown by a connect operation, makes a transition to a conductive state. After an antifuse element transitions to the conductive state, the antifuse element cannot be returned to the insulated state. Therefore, the antifuse elements of the fuse array 143 can be used as nonvolatile and irreversible storage elements. The antifuse elements of the fuse array 143 may be programmed using conventional antifuse programming circuits (not shown).

In some embodiments, antifuse elements of the fuse array 143 can be programmed to store precondition data. For example, the antifuse elements can be programmed with precondition data that specifies a known state to which a portion (e.g., all or a subset) of the memory array 150 should be programmed when the memory device is powered on. For example, the known state can include a predetermined string or sequence of data bits (e.g., all "1's"; all "0's"; alternating "1's" and "0's"; or another string/sequence of data bits) to be programmed to each memory row in the portion of the memory array 150. In these and other embodiments, the antifuse elements can be programmed with precondition data that identifies a portion (e.g., all or a subset) of the memory array 150 to precondition when the memory device is powered on.

As described in greater detail below, when the memory device 100 is powered on, the memory device 100 can be configured to automatically read the precondition data from the fuse array 143. In embodiments where the precondition data specifies a known state to which a portion of the memory array 150 should be programmed, the known state can be automatically loaded into the I/O circuit 160 and subsequently (automatically) written to a portion (all or a subset of) the memory array 150. In this manner, any valid information that persisted in the memory array 150 of the memory device 100 can be automatically overwritten when the memory device 100 is powered on. In these and other embodiments where the precondition data identifies a portion of the memory array 150 to precondition, the precondition data can be automatically read into the command decoder 115 of the memory device 100. Using the precondition data, the command decoder 115 can generate various internal signals and commands for performing the precondition operation, such as row command signals and column select signals to select memory rows and columns, respectively, in the portion of the memory array 150 identified in the precondition data. In turn, the memory device 100 can automatically precondition the portion of the memory array 150 identified in the precondition data to a desired state (e.g., a known or random state).

To program the portion of the memory array 150 to a random state, the memory device 100 can be configured to automatically fire multiple memory rows in the portion of the memory array 150 without powering the corresponding sense amps such that nearby memory rows overwrite and corrupt each other with their data. Thus, any valid information that persisted in the portion of the memory array 150 can be automatically corrupted when the memory device 100 is powered on. Preconditioning a portion of the memory array 150 to a random state is faster and consumes less power than preconditioning the portion of the memory array 150 to a known state because the memory device 100 does not retrieve and load the known state into the IO circuit 160 or another component of the memory device 100 or power corresponding sense amps before preconditioning a portion of the memory array 150. Therefore, the memory device 100 can be configured to precondition a portion of the memory array 150 to a random state in time or power saving scenarios.

Figure 2:
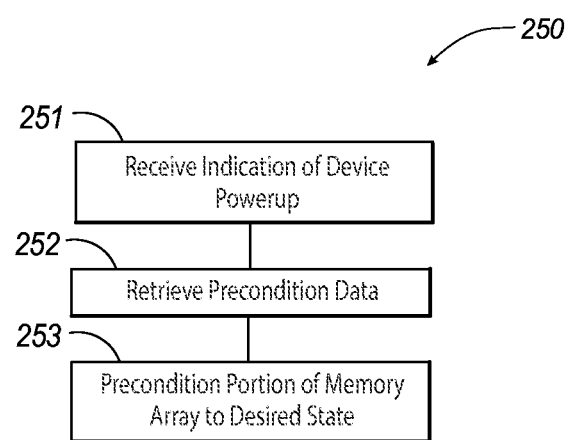
FIG. 2 is a flow diagram illustrating a background precondition routine of a memory device configured in accordance with various embodiments of the present technology.

FIG. 2 is a flow diagram illustrating a background precondition routine 250 of a memory device configured in accordance with various embodiments of the present technology. In some embodiments, the routine 250 can be executed, at least in part, by various components of the memory device. For example, all or a subset of the steps of the routine 250 can be carried out by a fuse array, a command decoder, an IO circuit, and/or a memory array of the memory device.

The routine 250 can begin at block 251 by receiving an indication that the memory device is powering on. In some embodiments, the indication that the memory device is powering on can be one or more potentials supplied to and/or generated by the voltage generator of the memory device. In response to the indication, the routine 250 can automatically proceed to block 252 and/or to block 253. In this manner, the routine 250 can be executed automatically without user intervention as an internal, background operation of the memory device. In other words, the routine 250 can be automatically executed before the memory device executes access (e.g., read or write) or other commands received from a user, a memory controller, and/or a host device of the memory device. In other embodiments, the routine 250 can begin at block 251 when one or more other events occur. For example, the routine 250 can begin at block 251 by receiving an indication that a RESET pin of the memory device is asserted and/or that a user has issued a precondition data command or sequence (e.g., a data "self-destruct" command).

At block 252, the routine 250 retrieves precondition data. All or a subset of the precondition data can be stored in the fuse array and/or another component of the memory device. In some embodiments, the precondition data can include instructions to precondition a portion of the memory array to a desired state. For example, the precondition data can include instructions to precondition a portion of the memory array to a known state and/or can specify a a predetermined string or sequence of data bits (e.g., all "1's"; all "0's"; alternating "1's" and "0's"; or another string/sequence of bits) to be programmed into the portion of the memory array. In these and other embodiments, the precondition data can include instructions to precondition a portion of the memory array to a random or corrupted state. In these and still other embodiments, the precondition data can identify a portion of the memory array to precondition. For example, the precondition data can include instructions to precondition the entire memory array to a desired state. In other embodiments, the precondition data can include instructions to precondition a subset (e.g., specific memory rows, specific memory banks, etc.) of the memory array to a desired state. After retrieving the precondition data, the routine 250 can automatically proceed to block 253 to precondition a portion of the memory array.

In some embodiments, the routine 250 can be configured to automatically proceed to block 253 from block 251 to precondition a portion of the memory array to a desired state without retrieving precondition data at block 252. For example, the desired state in some embodiments can be a random or corrupted state (as described in greater detail below) such that the routine 250 does not retrieve a known state specified in precondition data stored on the memory device. In these and other embodiments, the routine 250 can be configured to precondition all or a subset of the memory array to the desired state (e.g., by default) such that the routine 250 does not retrieve precondition data stored on the memory device that identifies a portion of the memory array.

At block 253, the routine 250 preconditions a portion of the memory array to a desired state. In embodiments where a portion of the memory array is specified in precondition data retrieved at block 252, the routine 250 can load the precondition data into a command decoder, which can issue row select commands to the row decoder and column select commands to the column decoder to precondition the corresponding portion of the memory array to a desired state.

As discussed above, the desired state can be a known state and/or a random state. In embodiments where the desired state is a known state that is specified in precondition data retrieved at block 252, the routine 250 can precondition a portion of the memory array (e.g., a portion identified in the precondition data) to the desired state by loading the known state into the IO circuit or another component of the memory device. For example, the routine 250 can power up write latches and/or sense amplifiers that correspond to memory rows in the portion of the memory array to the known state. In turn, the routine 250 can write and/or replicate the known state across the portion of the memory array such that routine 250 overwrites any valid information that persisted in the portion of the memory array before the routine 250 was executed.

Using a volatile double data rate fourth-generation (DDR4) memory device as an example, the routine 250 can precondition the memory array of the memory device by entering write compression and using a X16 memory device configuration to write the known, desired state to all memory banks in the memory array. In other embodiments, the routine 250 can use a different memory device configuration (e.g., a X4 and/or a X8 memory device configuration). In some embodiments, the routine 250 can use a greater amount of compression than is standard such that the routine 250 can write to more than one memory column at once. In these and other embodiments, the routine 250 can enter a test mode of the memory device to enable the routine 250 to issue more than one activate command to a memory bank. To write the known state to the memory array, the routine 250 can, for each section of a memory bank, (i) activate a memory row in the section, (ii) write a corresponding bit of the known state to each memory column in the activated memory row, and (iii) precharge the memory row. Assuming a memory row of the DDR4 memory device includes 2000 bits, the routine 250 (in this example) issues 16 write commands to fully program a memory row. Thus, assuming there are 1024 memory rows per section and 512 sections in the memory array, the routine 250 (in this example) can precondition the entire memory array in approximately 0.05 ms.

In embodiments where the desired state is a random or corrupted state, the routine 250 can precondition a portion of the memory array (e.g., a portion identified in the precondition data retrieved at block 252) to the random state by stepping through the portion of the memory array (e.g., using compression) in a similar manner, but by activating multiple memory rows without powering sense amps corresponding to the memory rows. In this manner, nearby (e.g., adjacent) memory rows overwrite and corrupt one another with their data such that the routine 250 corrupts any valid information that persisted in portion of the memory array before the routine 250 was executed. As discussed above, by preconditioning the portion of the memory array to the random state, the routine 250 can save time and power over preconditioning the portion of the memory array to a known state.

Although the steps of the routine 250 are discussed and illustrated in a particular order, the method illustrated by the routine 250 in FIG. 2 is not so limited. In other embodiments, the method can be performed in a different order. For example, any of the steps of the routine 250 can be performed before, during, and/or after any of the other steps of the routine 250. Moreover, a person of ordinary skill in the relevant art will readily recognize that the illustrated method can be altered and still remain within these and other embodiments of the present technology. For example, one or more steps of the routine 250 illustrated in FIG. 2 can be omitted and/or repeated in some embodiments.

Furthermore, although a DDR4 memory device is used in the above example, the routine 250 in other embodiments can be used to precondition other memory devices. For example, the routine 250 can be used to precondition a memory array of a nonvolatile memory device. In these and other embodiments, the routine 250 can be used to precondition a memory device that uses another generation of DDR (e.g., first-generation DDR, second-generation DDR, third-generation DDR, fifth-generation DDR, etc.). In these and still other embodiments, the routine 250 can be used to precondition a memory array have a greater or lesser number of memory banks, sections, sections per memory bank, memory rows, memory rows per section, memory columns, and/or memory columns per memory row.

In some embodiments, the routine 250 can be permanently or temporarily enabled or disabled. For example, the routine 250 can be enabled (e.g., by a manufacturer, by an end party, by an intermediary party, etc.) as a security feature on a memory device. When enabled, the routine 250 is automatically performed without user intervention as a background operation when (e.g., each time, the next time, selected subsequent times, etc.) the memory device is powered on. In these and other embodiments, the routine 250 can be disabled such that the routine 250 is not performed upon one or more subsequent powerups of the memory device. For example, an authorized user (e.g., a vendor, a service technician, etc.) can disable the routine 250 to test the device, to save power, and/or to preserve data (e.g., in the event of a faulty, malfunctioning, and/or hung host memory system in which the memory device is installed). In these and still other embodiments, the routine 250 can be disabled only if the routine 250 was executed upon a previous powerup (e.g., the most recent powerup) of the memory device.

In some embodiments, the routine 250 can be enabled or disabled using antifuse elements of the fuse array. For example, the routine 250 can be permanently enabled or disabled when a first antifuse element transitions to a conductive state when the first antifuse element is subjected to a dielectric breakdown by a connect operation. In other embodiments, the routine 250 can be temporarily enabled or disabled when the first antifuse element transitions to a conductive state (e.g., until a second antifuse element transitions to a conductive state). In these and other embodiments, the routine 250 can be toggled between being enabled and disabled. For example, the routine 250 can be disabled when the first antifuse element transitions to a conductive state, enabled when the second antifuse element subsequently transitions to a conductive state, disabled when a third antifuse element subsequently transitions to a conductive state, and so on.

Figure 3:
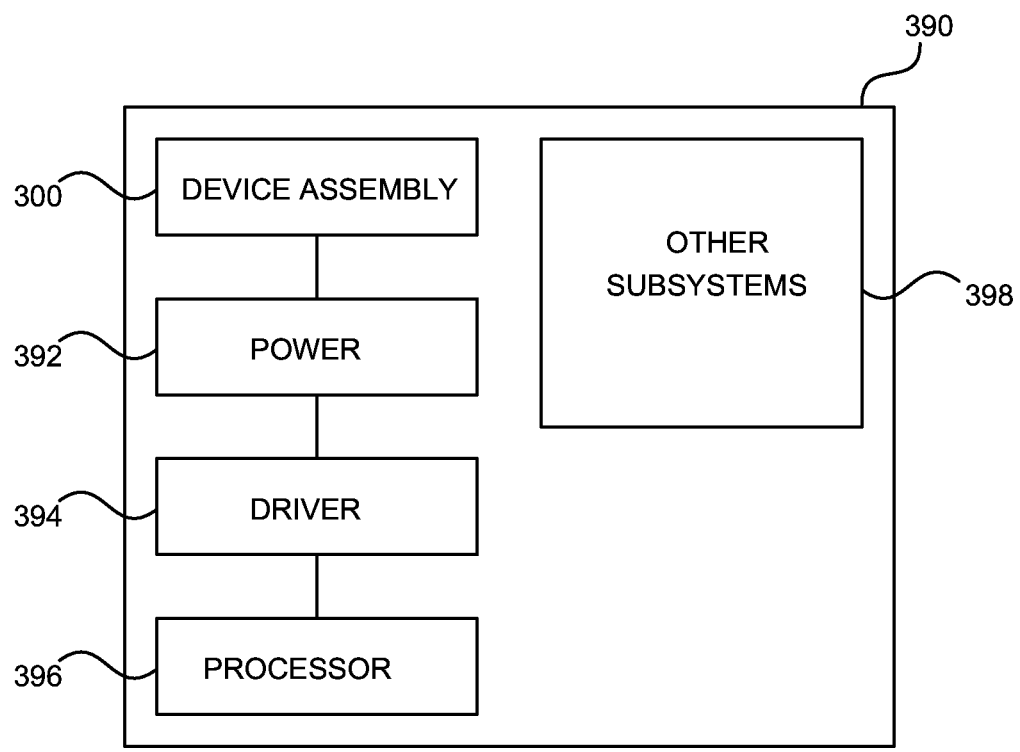
FIG. 3 is a schematic view of a system that includes a memory device configured in accordance with various embodiments of the present technology.

FIG. 3 is a schematic view of a system that includes a memory device in accordance with embodiments of the present technology. Any one of the foregoing memory devices described above with reference to FIGS. 1 and 2 can be incorporated into any of a myriad of larger and/or more complex systems, a representative example of which is system 390 shown schematically in FIG. 3. The system 390 can include a semiconductor device assembly 300, a power source 392, a driver 394, a processor 396, and/or other subsystems and components 398. The semiconductor device assembly 300 can include features generally similar to those of the memory device described above with reference to FIGS. 1 and 2, and can, therefore, include various features of automatic background precondition upon powerup. The resulting system 390 can perform any of a wide variety of functions, such as memory storage, data processing, and/or other suitable functions. Accordingly, representative systems 390 can include, without limitation, hand-held devices (e.g., mobile phones, tablets, digital readers, and digital audio players), computers, vehicles, appliances, and other products. Components of the system 390 may be housed in a single unit or distributed over multiple, interconnected units (e.g., through a communications network). The components of the system 390 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded. As used herein, the phrase "and/or" as in "A and/or B" refers to A alone, B alone, and both A and B.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory device, comprising:
a memory array including a plurality of memory cells arranged at intersections of memory rows and memory columns,
sense amplifiers corresponding to the memory rows,
a command decoder connected to the memory array, and
a fuse array connected to the command decoder, the fuse array having antifuse elements corresponding to the memory array,
wherein:
the antifuse elements are configured to store precondition data, and the memory device is configured to, during a powerup operation of the memory device, load the precondition data into the command decoder and write at least a portion of the memory array to a random data state before executing an access command received from a user, a memory controller, or a host device of the memory device, and
to write the portion of the memory array to the random data state, the memory device is configured to fire multiple memory rows of the memory array at the same time without powering the corresponding sense amplifiers such that data stored on memory cells of the multiple memory rows is overwritten and corrupted.

2. The memory device of claim 1, wherein the precondition data identifies the portion of the memory array.

3. The memory device of claim 2, wherein the memory device is further configured to automatically read the precondition data from the fuse array during the powerup operation of the memory device to identify the portion of the memory array before executing the access command.

4. The memory device of claim 1, wherein, the memory device is further configured to issue more than one activate command to the portion of the memory array to write the portion of the memory array to the random data state.

5. The memory device of claim 1, wherein the portion of the memory array includes every memory cell in the plurality of memory cells.

6. The memory device of claim 1, wherein the portion of the memory array includes only a subset of memory cells in the plurality of memory cells.

7. The memory device of claim 1, wherein the memory device is a dynamic random-access memory (DRAM) device.

8. The memory device of claim 1, wherein the command decoder is configured to generate (i) a row command signal to select a memory row in the portion of the memory array and (ii) a column command signal to select a memory column in the portion of the memory array for the memory device to write to the random data state during the powerup operation of the memory device.

9. A method, comprising:
  receiving an indication that a memory device is powering on, the memory device comprising a memory array having a plurality of memory cells arranged at intersections of a plurality of memory rows and a plurality of memory columns;
  in response to the indication, writing at least a portion of the memory array to a random data state before executing an access command received from a user, a memory controller, or a host device of the memory device, wherein writing the portion of the memory array to the random data state includes firing multiple memory rows in the portion of the memory array at the same time without powering sense amplifiers corresponding to the multiple memory rows such that data stored on memory cells of the multiple memory rows is overwritten and corrupted.

10. The method of claim 9, further comprising, in response to the indication, automatically reading precondition data stored on the memory device before executing the access command.

11. The method of claim 10, wherein the precondition data specifies the portion of the memory array, and wherein the method further comprises loading the precondition data into a command decoder of the memory device.

12. The method of claim 9, wherein writing the portion of the memory array to the random data state includes issuing more than one activate command to the portion of the memory array.

13. The method of claim 9, further comprising:
  receiving (a) an indication that a RESET pin of the memory device is asserted or (b) a precondition data command; and
  in response to the indication that the RESET pin of the memory device is asserted or the precondition data command, writing the portion of the memory array to the random data state before executing an access command.

14. A memory device, comprising:
  a memory array having a plurality of memory cells arranged at intersections of memory rows and memory columns; and
  sense amplifiers corresponding to the memory rows, wherein—
    the memory device is configured to, upon powerup of the memory device, write one or more memory cells of the plurality of memory cells to a random data state before executing an access command received from a user, a memory controller, or a host device of the memory device,
    to write the one or more memory cells to the random data state, the memory device is configured to fire multiple memory rows at the same time without powering sense amplifiers corresponding to the multiple memory rows such that data stored on memory cells of the multiple memory rows is overwritten and corrupted, and
    at least one memory row of the multiple memory rows corresponds to the one or more memory cells.

15. The memory device of claim 14, wherein, to write the one or more memory cells to the random data state, the memory device is further configured to issue more than one activate command to a memory region containing the one or more memory cells.

16. The memory device of claim 15, wherein the memory region includes only a subset of the memory cells of the plurality of memory cells.

17. The memory device of claim 14, wherein the one or more memory cells includes every memory cell of the plurality of memory cells.

18. The memory device of claim 14, further comprising a fuse array having antifuse elements corresponding to the memory array, wherein the antifuse elements are configured to store precondition data, and wherein the precondition data identifies the one or more memory cells.

19. The memory device of claim 18, wherein the memory device is further configured to read the precondition data from the fuse array during the powerup operation of the memory device to identify the one or more memory cells before executing the access command.

* * * * *